(12) United States Patent
Kim

(10) Patent No.: US 10,014,290 B2
(45) Date of Patent: Jul. 3, 2018

(54) SEMICONDUCTOR INTEGRATED CIRCUIT

(71) Applicant: SK hynix Inc., Icheon-si, Gyeonggi-do (KR)

(72) Inventor: Jong Su Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 393 days.

(21) Appl. No.: 14/989,211

(22) Filed: Jan. 6, 2016

(65) Prior Publication Data

US 2016/0118375 A1 Apr. 28, 2016

Related U.S. Application Data

(62) Division of application No. 14/019,070, filed on Sep. 5, 2013, now Pat. No. 9,263,883.

(30) Foreign Application Priority Data

Apr. 29, 2013 (KR) .......................... 10-2013-0047252

(51) Int. Cl.
*H02H 9/00* (2006.01)
*H01L 27/02* (2006.01)
*H02H 9/04* (2006.01)
*H01L 27/06* (2006.01)

(52) U.S. Cl.
CPC ...... *H01L 27/0281* (2013.01); *H01L 27/0266* (2013.01); *H01L 27/0288* (2013.01); *H01L 27/0629* (2013.01); *H02H 9/046* (2013.01)

(58) Field of Classification Search
CPC .................................................. H01L 27/0281
See application file for complete search history.

(56) References Cited

U.S. PATENT DOCUMENTS

| 6,347,026 | B1 * | 2/2002 | Sung ............... H01L 27/0251 361/111 |
| 9,263,883 | B2 * | 2/2016 | Kim .................. H01L 27/0281 |
| 2007/0096214 | A1 * | 5/2007 | Chen ................ H01L 27/0285 257/355 |
| 2011/0063763 | A1 * | 3/2011 | Alvarez ............ H01L 27/0281 361/56 |

FOREIGN PATENT DOCUMENTS

| KR | 1020080069899 A | 7/2008 |
| KR | 1020100084606 A | 7/2010 |

* cited by examiner

*Primary Examiner* — Stephen W Jackson
(74) *Attorney, Agent, or Firm* — William Park & Associates Ltd.

(57) ABSTRACT

A first power line configured to receive a first voltage, a second power line configured to receive a second voltage which is lower than the first voltage, a first clamping unit configured to be connected to the first power line, a second clamping unit configured to be connected between the first clamping unit and the second power line, and a discharging unit configured to, when an abnormal voltage introduced through the first power line or the second power line is applied, discharge the abnormal voltage by coupling with the first clamping unit or the second clamping unit are included.

6 Claims, 3 Drawing Sheets

SEMICONDUCTOR INTEGRATED CIRCUIT

CROSS-REFERENCES TO RELATED APPLICATION

The present application is a Division of U.S. application Ser. No. 14/019,070, filed on Sep. 5, 2013, and the present application claims priority under 35 U.S.C. § 119(a) to Korean application number 10-2013-0047252, filed on Apr. 29, 2013, in the Korean Intellectual Property Office, which is incorporated herein by reference in its entirety.

BACKGROUND

1. Technical Field

The various embodiments generally relate to a semiconductor integrated circuit, and more particularly, to a semiconductor integrated circuit including an electrical overstress protection circuit.

2. Related Art

An electrical overstress (EOS) phenomenon is a phenomenon in which, when a power voltage for a semiconductor integrated circuit is applied, an abnormal excessive voltage (or a spark voltage) is applied to temporarily cause an electrical discharge.

Such an EOS phenomenon may cause a circuit component failure, a circuit board failure, a triggering system failure, and the like. Also, such an EOS phenomenon may continue for a few microseconds to a few seconds.

When the EOS phenomenon is generated in an electronic circuit, a high power voltage can be applied to a line (e.g. a power line), to which a voltage is applied, for a few microseconds or more, so that thermal damage of the power line is more serious than the case of a normal electrostatic discharge (ESD) in which static electricity is transferred for a few pico-seconds.

That is to say, power lines and plugs connected to the power lines can be heated or melted by an excessive voltage applied for a long time. Therefore, demand for a protection circuit capable of effectively discharging a voltage when an excessive voltage is applied has increased.

In addition, together with such an excessive voltage, excessive power noise can be introduced, such power noise also has a problem of causing current leakage in a semiconductor integrated is circuit.

SUMMARY

In an embodiment of the present invention, a semiconductor integrated circuit includes: a first power line configured to receive a first voltage; a second power line configured to receive a second voltage which is lower than the first voltage; a first clamping unit configured to be connected to the first power line; a second clamping unit configured to be connected between the first clamping unit and the second power line; and a discharging unit configured to, when an abnormal voltage introduced through the first power line or the second power line is applied, discharge the abnormal voltage by coupling with the first clamping unit or the second clamping unit.

In an embodiment of the present invention, a semiconductor integrated circuit includes: a first power line configured to receive a first voltage; a second power line configured to receive a second voltage which is lower than the first voltage; a first protection circuit unit configured to be connected between the first and second power lines and to discharge an abnormal voltage introduced into the first power line; and a second protection circuit unit configured to be connected between the first and second power lines and to discharge an abnormal voltage introduced into the second power line, wherein the first and second protection circuit units comprises: a first clamping is unit configured to be connected to the first power line; a second clamping unit configured to be connected between the first clamping unit and the second power line; and a discharging unit configured to be connected between the first and second power lines, wherein: the discharging unit of the first protection circuit unit is configured to be driven by coupling with one selected from the first and second clamping units; and the discharging unit of the second protection circuit unit is configured to be driven by coupling with the other of the first and second clamping units.

In an embodiment of the present invention, a semiconductor integrated circuit includes: a first power line configured to receive a first voltage; a second power line configured to receive a second voltage which is lower than the first voltage; a first clamping unit configured to be connected to the first power line; a second clamping unit configured to be connected between the first clamping unit and the second power line, and to offset current linkage generated in the first clamping unit when abnormal noise is introduced into the first or second power line; and a discharging unit configured to be connected between the first power line and the second power line.

In an embodiment of the present invention, a semiconductor integrated circuit includes: a first power line configured to receive a first voltage; a second power line configured to receive a second voltage which is different than the first voltage; a first clamping unit configured to be connected to the first power line; a second clamping unit configured to be connected between the first clamping unit and the second power line; and a discharging unit configured to, when an abnormal voltage introduced through the first power line or the second power line is applied, discharge the abnormal voltage by coupling with the first clamping unit or the second clamping unit.

BRIEF DESCRIPTION OF THE DRAWINGS

Features, aspects, and embodiments are described in conjunction with the attached drawings, in which.

DETAILED DESCRIPTION

Hereinafter, a semiconductor integrated circuit according to the present invention will be described below with reference to the accompanying drawings through various embodiments.

Figure 1:
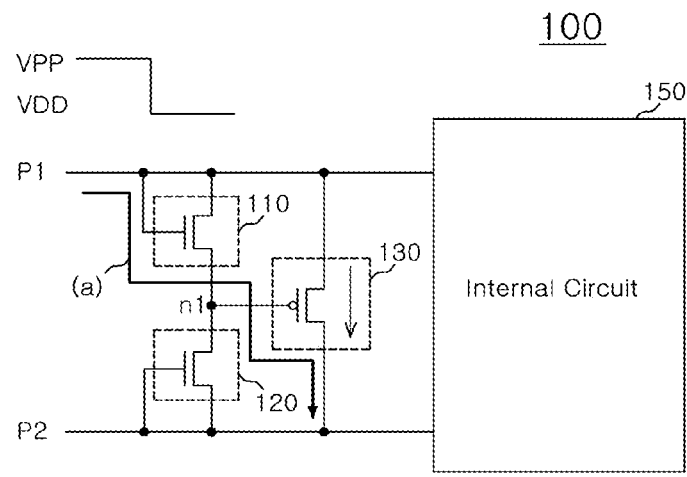
FIG. 1 is a circuit diagram illustrating a semiconductor integrated circuit according to an embodiment of the present invention.

Referring to FIG. 1, a protection circuit 100 for preventing electrical overstress (EOS) can include a first clamping unit 110, a second clamping unit 120, and a discharging unit 130, which are located between first and second power lines P1 and P2 having mutually different electric potentials.

The first power line P1 can be a line to which a power voltage is applied, and the second power line P2 can be a line to which a ground voltage is applied.

The first clamping unit 110 can be configured with an NMOS transistor, the gate and drain of which are connected to the first power line P1.

The second clamping unit 120 may be connected between the first clamping unit 110 and the second power line P2. The second clamping unit 120 can be an NMOS transistor, the gate and source of which are connected to the second power line P2.

The second clamping unit 120 may be configured with the same type of transistor as the first clamping unit 110, wherein the first and second clamping units 110 and 120 can be connected to operate mutually different directional diodes.

The discharging unit 130 may be connected between the first and second power lines P1 and P2, and may be configured to discharge the voltage of the first power line P1 according to the voltage of a connection node n1 between the first clamping unit 110 and the second clamping unit 120. According to an embodiment, the discharging unit 130 can be, for example, a PMOS transistor.

The protection circuit 100 having the configuration described above operates such that, when an excessive voltage VPP is temporarily applied from the first power line P1, the first clamping is unit 110 is turned on, and the connection node n1 is transitioned to a negative level "−(VPP−Vt)" by the coupling of the first clamping unit 110 and the discharging unit 130, so that the discharging unit 130 is driven. Accordingly, the excessive voltage is discharged to the second power line P2 through the first clamping unit 110 and the discharging unit 130. Reference sign "a" in the drawing indicates an excessive voltage discharge path.

As known, when an excessive voltage VPP is applied, power melting is generally generated in the lowest-resistance region. That is to say, when a normal power voltage is applied, a circuit component having the lowest resistance may be the first clamping unit 110. According to an embodiment of the present invention, when an excessive voltage VPP is applied to the first power line P1, melting of the first clamping unit 110 can be prevented by allowing the excessive voltage VPP to separately link through the first clamping unit 110 and the discharging unit 130.

Accordingly, it is possible to prevent an excessive voltage VPP from being introduced into an internal circuit 150.

In addition, an effect by an excessive voltage can be minimized by sufficiently spacing the distance between the protection circuit and a pad (not shown) to which the power lines P1 and P2 are connected. Additionally, a graph of excessive voltage VPP and a voltage less than the excessive voltage VPP VDD is illustrated in FIG. 1.

Figure 2:
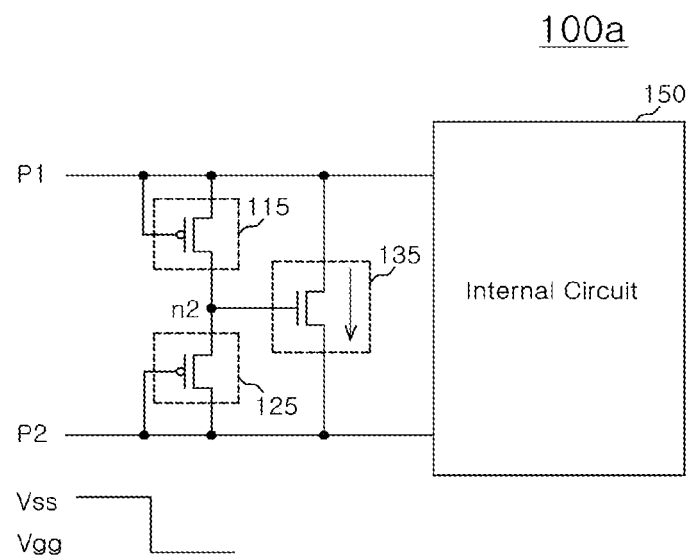
FIGS. 2 to 5 are circuit diagrams illustrating semiconductor integrated circuits according to other embodiments of the present invention.

Also, as illustrated in FIG. 2, a first clamping unit 115 of a protection circuit 100a can be configured with a PMOS transistor, the gate and source of which are connected to the first power line P1; and a second clamping unit 125 thereof can be configured with a PMOS transistor, the gate and drain of which are connected to the second power line P2.

A discharging unit 135 can be configured with an NMOS transistor to be coupled to the first clamping unit 115 or second clamping unit 125. The gate electrode of an NMOS transistor constituting the discharging unit 135 can be connected to a connection node n2 between the first clamping unit 115 and the second clamping unit 125.

The protection circuit 100a having the configuration described above operates such that, when an abnormal voltage Vgg is temporarily applied from the second power line P2, the second clamping unit 125 is turned on, and the voltage of the connection node n2 between the first clamping unit 115 and the second clamping unit 125 is transitioned to a positive level "−(Vgg−Vt)" by the coupling of the second clamping unit 125 and the discharging unit 135, so that the discharging unit 135 is driven. Accordingly, the abnormal voltage generated on the second power line P2 is separately discharged by the second clamping unit 125 and the discharging unit 135. Therefore, it is possible to reduce a phenomenon that an excessive voltage is concentrated on a specific element and melting is caused. Additionally, a graph of abnormal voltage Vgg and a voltage greater than the abnormal voltage Vgg Vss is illustrated in FIG. 2.

Figure 3:
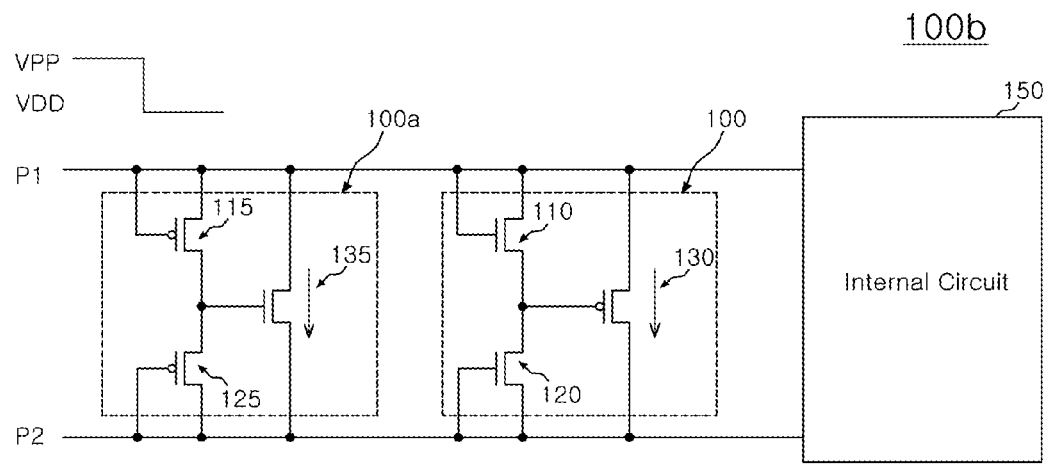

Also, as illustrated in FIG. 3, a first protection circuit 100a and a second protection circuit 100 can be doubly connected creating a protection circuit 100b. Wherever possible, the same reference numbers will be used throughout the drawings to refer to the same or like parts. The first protection circuit 100a can have the same configuration as that illustrated in FIG. 2, and the second protection circuit 100 can have the same configuration as that illustrated in FIG. 1. In addition, the connection order of the first protection circuit 100a and second protection circuit 100 can vary. In the case in which the first protection circuit 100a and second protection circuit 100 are doubly connected, abnormal voltages are simultaneously introduced through a first power line P1 and a second power line P2, it is possible to discharge the abnormal voltages in both directions according to the aforementioned principle. Additionally, a graph of excessive voltage VPP and a voltage less than the excessive voltage VPP VDD is illustrated in FIG. 3.

Figure 4:
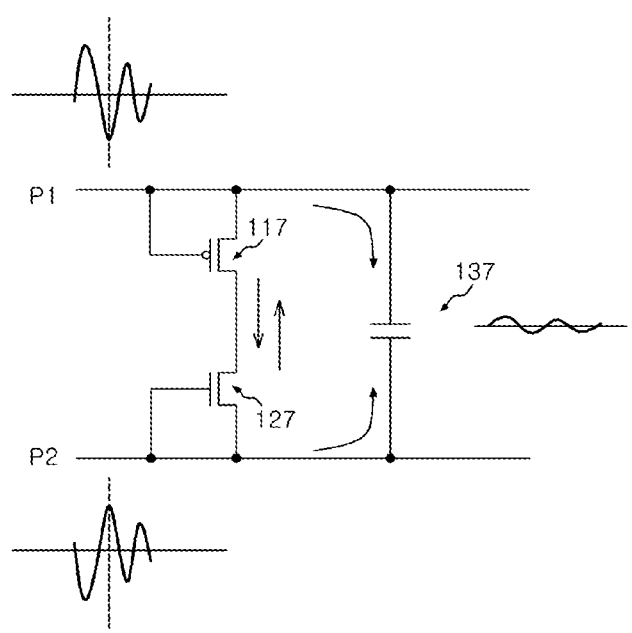

Also, as illustrated in FIG. 4, a first clamping unit 117 can be configured with a PMOS transistor, the gate and source of which are connected to a first power line P1; and a second clamping unit 127 can be configured with an NMOS transistor, the gate and source of which are connected to a second power line P2. A discharging unit 137 can be a capacitor connected between the first power line P1 and the second power line P2.

When an abnormal voltage, e.g. power noise, is introduced into the first and second power line P1 and P2, the electric potential of each gate of the first clamping unit 117 and second clamping unit 127 is shaken as shown in the graphs above and below first and second power lines P1 and P2.

Accordingly, an interference and coupling are generated between the first clamping unit 117 and the second clamping unit 127, and thus current linkage is caused. In this case, the current linkage first offsets and eliminates power noise generated in the power lines P1 and P2. Additionally, the current linkage can discharge residual power noise through the discharging unit 137.

Figure 5:
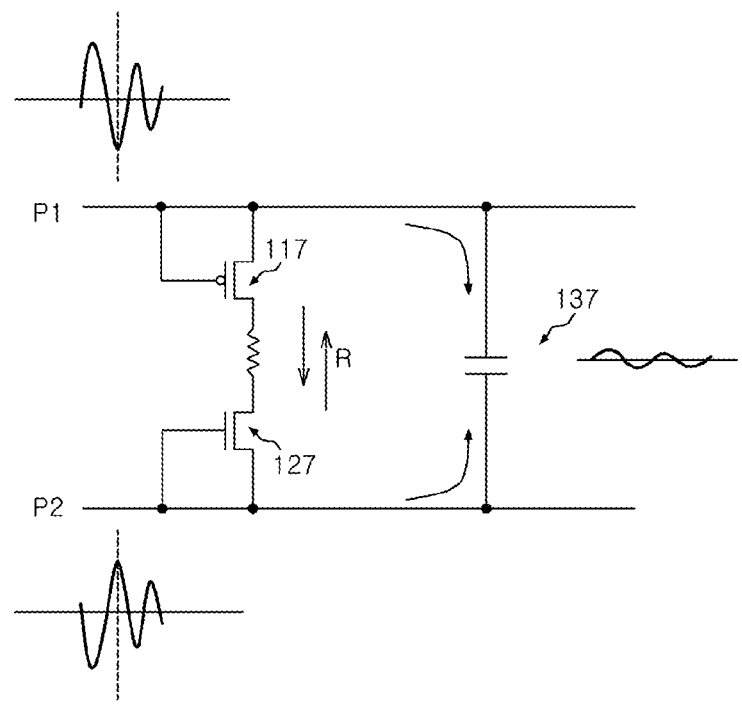

In this case, as illustrated in FIG. 5, a resistor R can be connected between the first clamping unit 117 and the second clamping unit 127 to stabilize the protection circuit. Wherever possible, the same reference numbers will be used throughout the drawings to refer to the same or like parts.

According to the present invention, when an abnormal voltage applied through power lines is introduced, the abnormal voltage is separately discharged by linkage using a coupling between elements, so that a power voltage and power noise can be effectively discharged.

While certain embodiments have been described above, it will be understood to those skilled in the art that the embodiments described are by way of example only. Accordingly, the device described herein should not be limited based on the described embodiments.

What is claimed is:

1. A semiconductor integrated circuit comprising:
   a first power line configured to receive a first voltage;

a second power line configured to receive a second voltage which is lower than the first voltage;

a first protection circuit unit configured to be connected between the first and second power lines and to discharge an abnormal voltage introduced into the first power line; and a second protection circuit unit configured to be connected between the first and second power lines and to discharge an abnormal voltage introduced into the second power line, wherein the first and second protection circuit units comprises:

a first clamping unit configured to be connected to the first is power line;

a second clamping unit configured to be connected between the first clamping unit and the second power line; and a discharging unit configured to be connected between the first and second power lines, wherein:

the discharging unit of the first protection circuit unit is configured to be driven by coupling with one of the first and second clamping units; and the discharging unit of the second protection circuit unit is configured to be driven by coupling with the other of the first and second clamping units.

2. The semiconductor integrated circuit according to claim 1, wherein:

the first and second clamping units of the first protection circuit unit are configured with a first type of MOS transistor; and the first and second clamping units of the second protection circuit unit are configured with a second type of MOS transistor which is opposite to the first type of MOS transistor.

3. The semiconductor integrated circuit according to claim 2, wherein:

the discharging unit of the first protection circuit unit is configured with the second type of MOS transistor; and the discharging unit of the second protection circuit unit is configured with the first type of MOS transistor.

4. The semiconductor integrated circuit according to claim 2, wherein:

the first clamping unit of the first protection circuit unit is configured with a PMOS transistor the gate and source of which are connected to the first power line;

the second clamping unit of the first protection circuit unit is configured with a PMOS transistor the gate and drain of which are connected to the second power line; and the discharging unit of the first protection circuit unit is configured to be coupled with the second clamping unit and to be driven when an abnormal voltage is introduced into the second power line.

5. The semiconductor integrated circuit according to claim 2, wherein:

the first clamping unit of the second protection circuit unit is configured with an NMOS transistor the gate and drain of which are connected to the first power line;

the second clamping unit of the second protection circuit unit is configured with an NMOS transistor the gate and source of which are connected to the second power line; and the discharging unit of the second protection circuit unit is configured with a PMOS transistor which is coupled with the first clamping unit and is driven when an abnormal voltage is introduced into the first power line.

6. The semiconductor integrated circuit according to claim 1, further comprising an internal circuit connected to the first power line and the second power line.

* * * * *